(12) United States Patent
Handa

(10) Patent No.: US 8,758,551 B2
(45) Date of Patent: *Jun. 24, 2014

(54) SUBSTRATE PROCESSING APPARATUS AND ELECTRODE STRUCTURE

(71) Applicant: Tokyo Electron Limited, Minato-ku (JP)

(72) Inventor: Tatsuya Handa, Nirasaki (JP)

(73) Assignee: Tokyo Electron Limited, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/922,892

(22) Filed: Jun. 20, 2013

(65) Prior Publication Data

US 2013/0276982 A1    Oct. 24, 2013

Related U.S. Application Data

(63) Continuation of application No. 13/617,665, filed on Sep. 14, 2012, now Pat. No. 8,480,849, which is a continuation of application No. 12/029,728, filed on Feb. 12, 2008, now Pat. No. 8,282,770.

(60) Provisional application No. 60/938,729, filed on May 18, 2007.

(30) Foreign Application Priority Data

Mar. 12, 2007   (JP) ................................. 2007-061749

(51) Int. Cl.
*H01L 21/306*  (2006.01)
*C23F 1/00*  (2006.01)

(52) U.S. Cl.
USPC .................................. 156/345.44; 156/345.34

(58) Field of Classification Search
USPC ........................................ 156/345.44, 345.34
See application file for complete search history.

(56) References Cited

U.S. PATENT DOCUMENTS

| | | | |
|---|---|---|---|
| 5,453,124 A | 9/1995 | Moslehi et al. | |
| 6,123,775 A | 9/2000 | Hao et al. | |
| 6,444,039 B1 | 9/2002 | Nguyen | |
| 6,812,646 B2 | 11/2004 | Windhorn et al. | |
| 8,282,770 B2 | 10/2012 | Handa | |
| 2001/0042799 A1 | 11/2001 | Kim et al. | |

(Continued)

FOREIGN PATENT DOCUMENTS

| | | |
|---|---|---|
| JP | 08-325759 | 12/1996 |
| JP | 2001-127046 | 5/2001 |

(Continued)

*Primary Examiner* — Keath Chen
(74) *Attorney, Agent, or Firm* — Oblon, Spivak, McClelland, Maier & Neustadt, L.L.P.

(57) ABSTRACT

A substrate processing apparatus capable of preventing the abnormal discharge from being generated on a substrate. A housing chamber houses the substrate. A mounting stage arranged in the housing chamber, is configured to enable the substrate to be mounted thereon. A disc-like electrode structure is connected to a high-frequency power supply, and connected to a gas supply apparatus via at least one gas supply system. The electrode structure has therein at least one buffer chamber and a plurality of connecting sections connected to the gas supply system. The buffer chamber is communicated with the inside of the housing chamber via a number of gas holes, and is communicated with the gas supply system via the plurality of connecting sections. The plurality of connecting sections for the buffer chamber are arranged on the circumference of a circle centering around the center of the electrode structure at equal intervals.

7 Claims, 7 Drawing Sheets

(56) References Cited

U.S. PATENT DOCUMENTS

| | | |
|---|---|---|
| 2005/0001555 A1 | 1/2005 | Parsons et al. |
| 2005/0011456 A1 | 1/2005 | Himori et al. |
| 2006/0016559 A1 | 1/2006 | Kobayashi et al. |
| 2006/0042754 A1 | 3/2006 | Yoshida et al. |
| 2006/0191480 A1 | 8/2006 | Kishimoto et al. |
| 2007/0022954 A1 | 2/2007 | Iizuka et al. |

FOREIGN PATENT DOCUMENTS

| | | |
|---|---|---|
| JP | 2003-257937 | 9/2003 |
| JP | 2006-66855 | 3/2006 |
| JP | 2007-335755 | 12/2007 |

SUBSTRATE PROCESSING APPARATUS AND ELECTRODE STRUCTURE

CROSS-REFERENCE TO RELATED APPLICATIONS

The present application is a continuation of U.S. application Ser. No. 13/617,665 filed Sep. 14, 2012. U.S. application Ser. No. 13/617,665 is a continuation of U.S. application Ser. No. 12/029,728, filed on Feb. 12, 2008, the entire content of each are incorporated herein by reference. U.S. application Ser. No. 12/029,728 claims the benefit of priority under 119 (e) of U.S. Provisional Application Ser. No. 60/938,729, filed May 18, 2007, and claims the benefit of priority under 35 U.S.C. 119 from Japanese Application No. 2007-061749 filed Mar. 12, 2007.

BACKGROUND OF THE INVENTION

1. Field of the Invention

The present invention relates to a substrate processing apparatus and an electrode structure, and more particularly to a substrate processing apparatus including an electrode structure which is connected to a high-frequency power supply and to a gas supply apparatus adapted to supply processing gas.

2. Description of the Related Art

As a substrate processing apparatus 60 adapted to perform plasma processing, for example, etching processing to a wafer W as a substrate, there is known, as shown in FIG. 6, an apparatus configured by including: a chamber 61 which houses the wafer W; a mounting stage 62 which is arranged in the chamber 61 and on which the wafer W is mounted; and a disc-like shower head 63 which is arranged opposite to the mounting stage 62, and which introduces processing gas into the chamber 61. In the substrate processing apparatus 60, high-frequency power supplies 64 and 65 are respectively connected to the mounting stage 62 and the shower head 63, which also function as electrodes. Then, the mounting stage 62 and the shower head 63 supply high-frequency power to the inside of the chamber 61, so that an electric field is generated in the chamber 61. The electric field generates plasma from the processing gas, so that the plasma performs plasma processing to the wafer W.

Meanwhile, in order to perform the plasma processing uniformly to the wafer W, it is necessary to make uniform the distribution of plasma density on the wafer W. However, in order to make uniform the distribution of plasma density, it is necessary to make uniform the distribution of the electric field. Thus, for example, as in the substrate processing apparatus 60, there has been developed a substrate processing apparatus 60 in which branching waveguides (power supply tubes) 66 connected to the high-frequency power supply 65 and connected to the shower head 63 symmetrically around the center of the shower head 63 are provided, to thereby make uniform the distribution of the electric field (for example, see Japanese Patent Laid-Open Publication No. 8-325759).

Further, the distribution of plasma density is influenced by the distribution of processing gas introduced from the shower head. Accordingly, it is known that as shown in FIG. 7, in an electrode structure 70 of the substrate processing apparatus, two mutually separated buffer chambers 72a and 72b are provided in a shower head 71, and a gas supply apparatus (not shown) for supplying processing gas is connected to each of the buffer chambers 72a and 72b via separate gas supply systems 73a and 73b, respectively, so as to control the flow rate of the processing gas in each of the gas supply systems 73a and 73b. In the electrode structure 70, each of the buffer chambers 72a and 72b is communicated with the inside of the chamber which houses a wafer, and the flow rate of the processing gas supplied to the inside of the buffer chambers 72a and 72b is controlled, so as to enable the shower head 71 to control the distribution of the processing gas introduced into the chamber.

Note that in the electrode structure 70, connecting sections 74a and 74b, which respectively connect the gas supply systems 73a and 73b to the buffer chambers 72a and 72b, are arranged at the same angle with respect to the center of the shower head 71, that is, in the same radial direction.

However, when the etching processing is performed to the wafer W by using the above described electrode structure 70 shown in FIG. 7, micro abnormal discharge (arcing) has been sometimes generated on the wafer W. Specifically, the arcing has been generated at the positions symmetrical with the positions at which the connecting sections 74a and 74b are arranged, with respect to the center of the shower head 71. The arcing may destroy a wiring and an insulating film of the semiconductor device which are formed on the wafer W, and hence it is necessary to prevent the generation of the arcing.

SUMMARY OF THE INVENTION

The present invention provides a substrate processing apparatus and an electrode structure which are capable of preventing the abnormal discharge from being generated on the substrate.

Accordingly, in a first aspect of the present invention, there is provided a substrate processing apparatus comprising a housing chamber configured to house a disc-like substrate, a mounting stage arranged in the housing chamber and configured to enable the substrate to be mounted thereon, a high-frequency power supply, a gas supply apparatus configured to supply processing gas, and a disc-like electrode structure connected to the high-frequency power supply, and connected to the gas supply apparatus via at least one gas supply system, wherein the electrode structure is arranged opposite to the mounting stage, and has therein at least one buffer chamber and a plurality of connecting sections connected to the gas supply system, wherein the buffer chamber is communicated with the inside of the housing chamber via a number of gas holes, and is communicated with the gas supply system via the plurality of connecting sections, and wherein the plurality of connecting sections for the buffer chamber are arranged on the circumference of a circle centering around the center of the electrode structure at equal intervals.

According to the first aspect of the present invention, in the each buffer chamber provided in the electrode structure connected to the high-frequency power supply, the plurality of connecting sections connected to the at least one gas supply system are arranged on the circumference of a circle centering around the center of the electrode structure at equal intervals. This enables the processing gas to be uniformly supplied to the inside of the each buffer chamber, so that the distribution of the processing gas introduced into the housing chamber via the each buffer chamber can be made uniform. Also, this enables the structure of the electrode structure to be made symmetrical about the center of the electrode structure, so that the distribution of the electric field generated in the housing chamber can be made uniform. As a result, the distribution of plasma density on the substrate can be made uniform, so that the generation of the abnormal discharge on the substrate can be prevented.

The first aspect of the present invention can provide a substrate processing apparatus, wherein the electrode structure has therein a plurality of buffer chambers, and wherein when the total number of the connecting sections corresponding to all the buffer chambers is set to n, the each connecting section is arranged at each rotational angle of 360°/n±3° around the center of the electrode structure.

According to the first aspect of the present invention, when the total number of the connecting sections corresponding to all the buffer chambers is set to n, the each connecting section is arranged at each rotational angle of 360°/n±3° about the center of the electrode structure. Thereby, the distribution of the processing gas introduced into the housing chamber via the each buffer chamber can be made more uniform, and the structure of the electrode structure can be made more symmetrical.

The first aspect of the present invention can provide a substrate processing apparatus, wherein the electrode structure is configured by a ceiling electrode plate, a cooling plate, and an upper electrode body which are stacked in this order from the side of the housing chamber, and the ceiling electrode plate, the cooling plate, and the upper electrode body are made of a conductive material, and wherein the plurality of connecting sections are arranged on the upper electrode body, and the upper electrode body is connected to the high-frequency power supply.

According to the first aspect of the present invention, the plurality of connecting sections are arranged on the upper electrode body connected to the high-frequency power supply, and hence the structure of the upper electrode body to which the high-frequency power is supplied can be made symmetrical. Thereby, the distribution of the electric field generated in the housing chamber can be surely made uniform.

The first aspect of the present invention can provide a substrate processing apparatus, wherein at least a portion of the gas supply system, which portion is connected to the connecting section, is made of an insulating material.

According to the first aspect of the present invention, at least a portion of the gas supply system, which portion is connected to the connecting section, is made of an insulating material, and hence the gas supply system does not affect the distribution of the electric field. Thereby, the distribution of the electric field generated in the housing chamber can be more surely made uniform.

Accordingly, in a second aspect of the present invention, there is provided an electrode structure provided in a substrate processing apparatus which includes a housing chamber configured to house a disc-like substrate, a mounting stage arranged in the housing chamber and configured to enable the substrate to be mounted thereon, a high-frequency power supply, and a gas supply apparatus configured to supply processing gas, wherein the electrode structure has a disc-like shape, and is connected to the high-frequency power supply, and connected to the gas supply apparatus via at least one gas supply system, wherein the electrode structure is arranged opposite to the mounting stage, and has therein at least one buffer chamber and a plurality of connecting sections connected to the gas supply system, wherein the each buffer chamber is communicated with the inside of the housing chamber via a number of gas holes, and is communicated with the gas supply system via the plurality of connecting sections, and wherein the plurality of connecting sections for the each buffer chamber are arranged on the circumference of a circle centering around the center of the electrode structure at equal intervals.

The features and advantages of the invention will become more apparent from the following detailed description taken in conjunction with the accompanying drawings.

BRIEF DESCRIPTION OF THE DRAWINGS

FIG. 4A shows the etching rate distribution at the time when the conventional substrate processing apparatus is used; and FIG. 4B shows the etching rate distribution at the time when the substrate processing apparatus according to the present embodiment is used.

FIG. 5A shows the etching rate distribution at the time when the conventional substrate processing apparatus is used; and FIG. 5B shows the etching rate distribution at the time when the substrate processing apparatus according to the present embodiment is used.

DETAILED DESCRIPTION OF THE PREFERRED EMBODIMENTS

In the following, embodiments according to the present invention will be described with reference to the accompanying drawings.

First, a substrate processing apparatus according to an embodiment of the present invention will be described.

Figure 1:
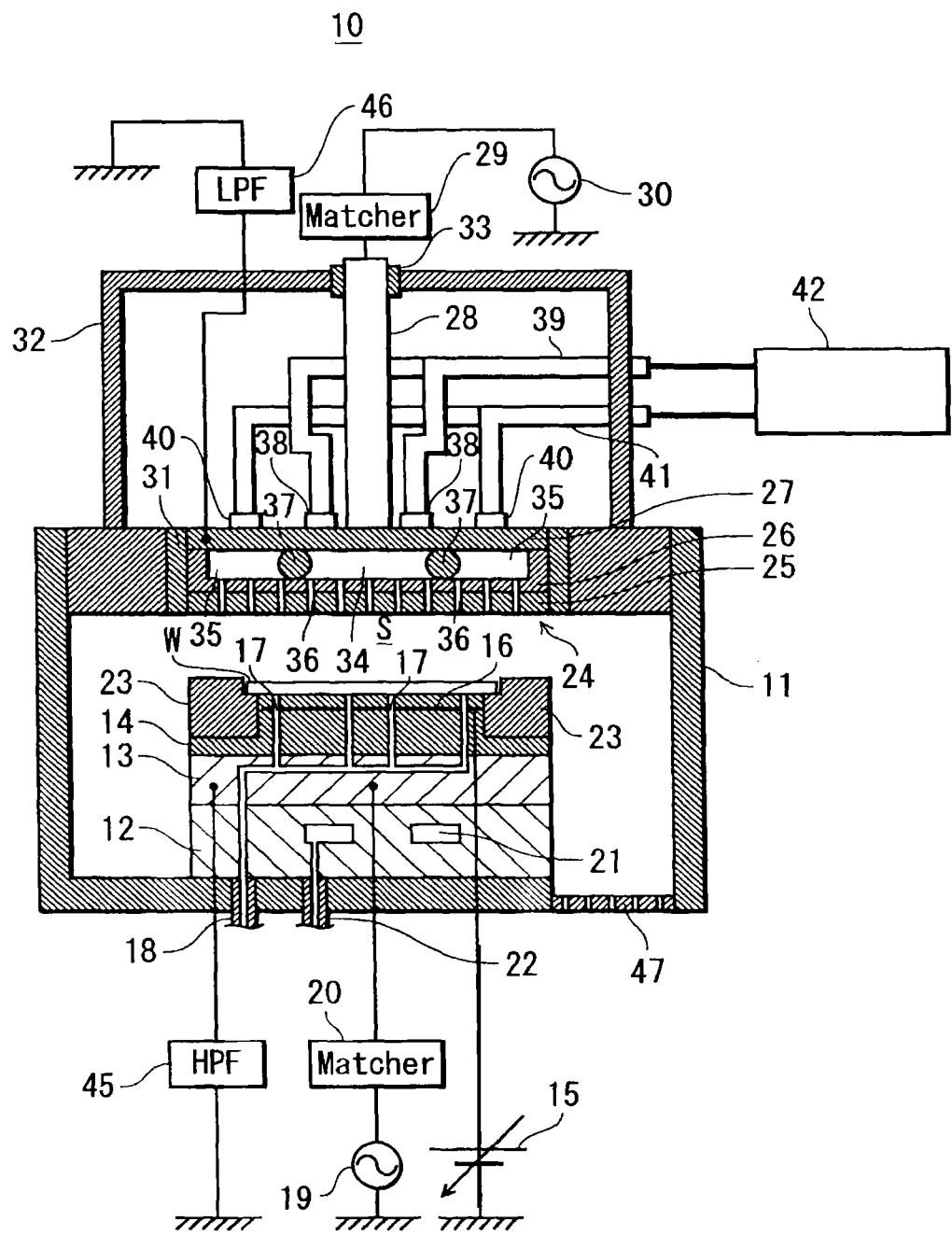
FIG. 1 is a sectional view schematically showing a configuration of a substrate processing apparatus according to an embodiment of the present invention.

FIG. 1 is a sectional view schematically showing a configuration of a substrate processing apparatus according to an embodiment of the present invention. The substrate processing apparatus is configured such that etching processing as plasma processing is performed to a semiconductor wafer as a substrate.

In FIG. 1, the substrate processing apparatus 10 has, for example, a chamber 11 (housing chamber) which houses a disc-like semiconductor wafer (hereinafter referred to as simply "wafer") W having a diameter of 300 mm. A cylindrical susceptor supporting stage 12 is arranged on the bottom surface inside the chamber 11, and a cylindrical susceptor 13 (mounting stage) is arranged on the susceptor supporting stage 12.

An ESC (Electrostatic Chuck) 14 (mounting stage) is arranged on the susceptor 13. The ESC 14 is made of, for example, aluminum. A ceramic material such as alumina, or the like, is thermally sprayed onto the upper surface of the ESC 14 to form a thermally sprayed film (not shown). In the thermally sprayed film, there is provided an electrostatic electrode plate 16 to which a DC power supply 15 is electrically connected.

The wafer W housed in the chamber 11 is mounted on the upper surface (hereinafter referred to as "mounting surface") of the ESC 14. When a positive DC voltage is applied to the electrostatic electrode plate 16 from the DC power supply 15, a negative potential is generated in the contact surface of the wafer W in contact with the mounting surface, to cause a potential difference between the electrostatic electrode plate 16 and the contact surface of the wafer W. As a result, the wafer W is attracted to be held on the mounting surface of the ESC 14 by the Coulomb force or Johnson Rahbeck force resulting from the potential difference.

A plurality of heat transfer gas supply holes 17 are opened in the mounting surface of the ESC 14. The plurality of heat transfer gas supply holes 17 are connected to a heat transfer gas supply section (not shown) via a heat transfer gas supply line 18. The heat transfer gas supply section supplies helium (He) gas as the heat transfer gas between the contact surface of the wafer W and the mounting surface via the heat transfer gas supply holes 17. The helium gas supplied to the gap between the contact surface of the wafer W and the mounting surface effectively transfers the heat of the wafer W to the ESC 14.

The susceptor 13 is made of, for example, an aluminum alloy, and is connected to a lower high-frequency power supply 19 via a lower matching box (Matcher) 20, and the lower high-frequency power supply 19 supplies high-frequency power of relatively low frequency to the susceptor 13. Thereby, the susceptor 13 functions as a lower electrode for supplying the high-frequency power to a processing space S which is a space between the susceptor 13 and a shower head 24 as will be described below. Further, the lower matching box 20 matches the internal impedance of the lower high-frequency power supply 19 with a load impedance.

Inside the susceptor supporting stage 12, for example, there is provided an annular coolant chamber 21 extending in the circumferential direction. To the coolant chamber 21, low-temperature coolant such as, for example, cooling water and Galden (registered trademark) fluid is circulated and supplied via a coolant pipe 22 from a chiller unit (not shown). The susceptor supporting stage 12 cooled by the low-temperature coolant cools the wafer W via the ESC 14.

Further, an annular focus ring 23 is arranged on the ESC 14. The focus ring 23 is made of a conductive material such as, for example, silicon, and surrounds the wafer W which is attracted to be held on the mounting surface of the ESC 14. Further, the focus ring 23 converges plasma generated in the processing space S to the surface of the wafer W, to thereby improve the efficiency of the etching processing.

The disc-like shower head 24 (electrode structure) is arranged in the ceiling section of the chamber 11, so as to face the wafer W mounted on the ESC 14. The shower head 24 has a ceiling electrode plate 25, a cooling plate 26, and an upper electrode supporting body 27 (upper electrode body) which are stacked in this order from the side of the processing space S. An upper high-frequency power supply 30 is connected to the upper electrode supporting body 27 via a power supply tube 28 and an upper matching box 29. The upper high-frequency power supply 30 supplies high-frequency power of a relatively high frequency to the upper electrode supporting body 27. The ceiling electrode plate 25, the cooling plate 26, and the upper electrode supporting body 27 are made of a conductive material such as, for example, an aluminum alloy, and hence the high-frequency power supplied to the upper electrode supporting body 27 is supplied to the processing space S via the cooling plate 26 and the ceiling electrode plate 25. That is, the shower head 24 functions as an upper electrode for supplying the high-frequency power to the processing space S. Note that the function of the upper matching box 29 is the same as the function of the above described lower matching box 20.

Note that the outer periphery of the shower head 24 is covered by an annular dielectric member 31 which insulates the shower head 24 from the wall of the chamber 11. Further, the outside of the power supply tube 28 is covered by a case-shaped grounding conductive member 32, and the power supply tube 28 penetrates the upper-surface central portion of the grounding conductive member 32. In the penetrating section, an insulating member 33 is provided between the grounding conductive member 32 and the power supply tube 28.

Further, in the shower head 24, the cooling plate 26 has, in the inside thereof, a central buffer chamber 34 formed of a disc-like space centering on the center (hereinafter referred to as "shower head center") of the shower head 24, and a peripheral buffer chamber 35 formed of an annular space concentric with the central buffer chamber 34. The central buffer chamber 34 and the peripheral buffer chamber 35 are separated by an annular partition wall member such as, for example, an O ring 37. Further, the cooling plate 26 and the ceiling electrode plate 25 have a number of penetrating gas holes 36 through which the central buffer chamber 34 and the peripheral buffer chamber 35 are communicated with the processing space S.

Further, in the shower head 24, a plurality of clamps 38 and 40 (connecting sections) made of a conductive material such as, for example, aluminum are arranged on the upper electrode supporting body 27. Specifically, two clamps 38 are arranged at positions corresponding to the central buffer chamber 34, and two clamps 40 are arranged at positions corresponding to the peripheral buffer chamber 35. The two clamps 38 are connected to a central gas supply system 39 consisting of two branched pipes. The two clamps 40 are connected to a peripheral gas supply system 41 consisting of two branched pipes. Note that in the central gas supply system 39 and the peripheral gas supply system 41, the portions respectively connected to the clamps 38 and 40, specifically, the portions existing in the inside of the grounding conductive member 32, are made of an insulating material, specifically, a resin.

The central buffer chamber 34 is communicated with the central gas supply system 39 via the two clamps 38, and the peripheral buffer chamber 35 is communicated with the peripheral gas supply system 41 via the two clamps 40. Note that the central gas supply system 39 and the peripheral gas supply system 41 are connected to a branch flow rate adjusting apparatus 42 which adjusts the flow rates of the mixture of processing gas and additional gas to the central gas supply system 39 and the peripheral gas supply system 41, respectively. The branch flow rate adjusting apparatus 42 is connected to a processing gas supply apparatus for supplying the processing gas, and to an additional gas supply apparatus for supplying the additional gas (both not shown). Note that the processing gas in the present embodiment corresponds to, for example, CF-based gas and oxygen gas, and the additional gas corresponds to, for example, argon gas.

In the shower head 24, the mixed gas containing the processing gas is introduced into the central buffer chamber 34 and the peripheral buffer chamber 35 from the branch flow rate adjusting apparatus 42 via the central gas supply system 39 and the peripheral gas supply system 41. The introduced mixed gas is introduced into the processing space S via a number of the penetrating gas holes 36. Therefore, the shower head 24 functions as a gas introducing device. Further, in the shower head 24, a coolant chamber (not shown) is provided in the cooling plate 26. A coolant such as, for example, cooling water and Galden (registered trademark) fluid introduced from coolant introducing sections 43a and 43b as will be described below, is supplied to the inside of the coolant chamber. The cooling plate 26 cools the mixed gas introduced into the central buffer chamber 34 and the peripheral buffer chamber 35 by the coolant in the coolant chamber.

In the present embodiment, the mixed gas introduced from the penetrating gas holes 36 corresponding to the peripheral buffer chamber 35 is distribution-diffused toward the periphery of the wafer W mounted on the mounting surface, and the mixed gas introduced from the penetrating gas holes 36 corresponding to the central buffer chamber 34 is distribution-diffused toward the central portion of the wafer W mounted on the mounting surface. Note that the density distribution of the mixed gas on the wafer W can be adjusted by adjusting the flow rate of the mixed gas which is distributed to each of the central gas supply system 39 and the peripheral gas supply system 41 by the branch flow rate adjusting apparatus 42.

Figure 2:
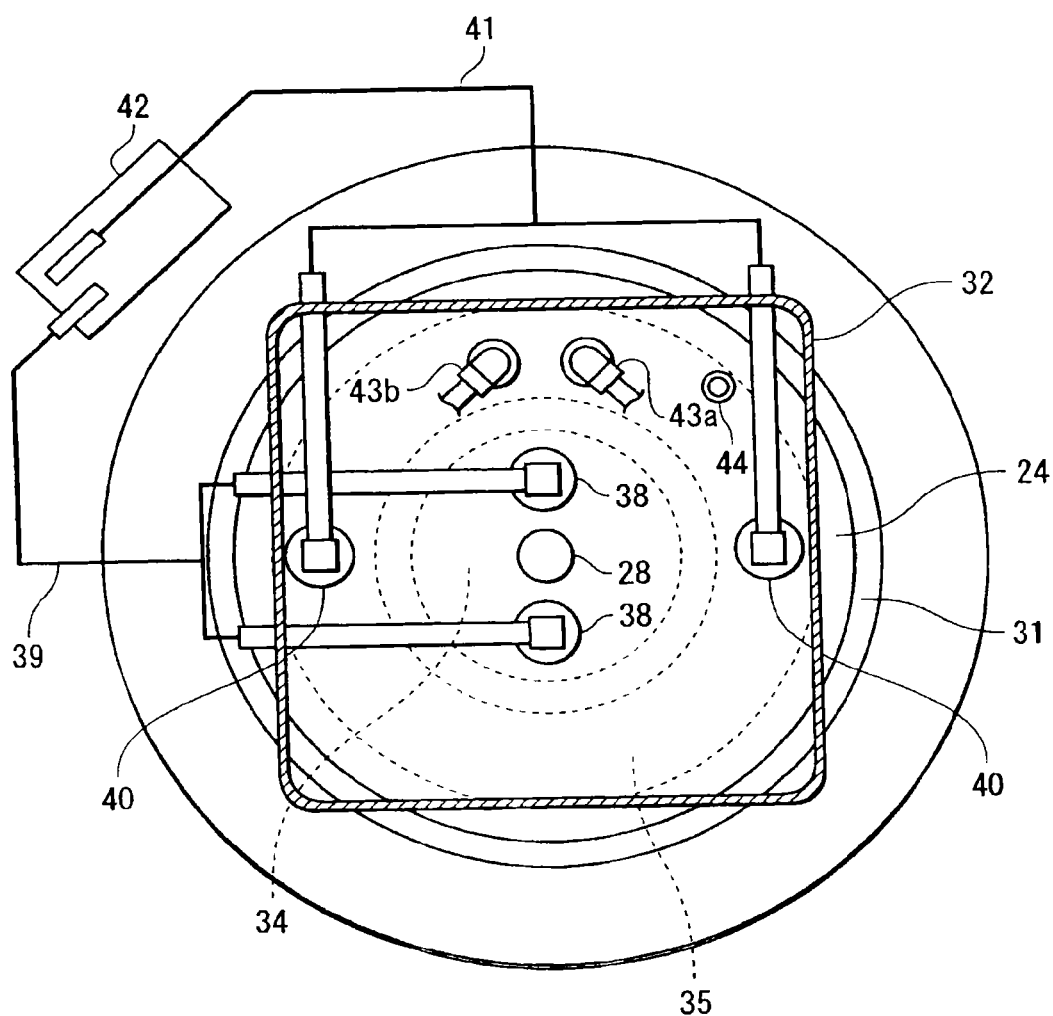
FIG. 2 is a plan view schematically showing a positional relation between the shower head, the clamp, the central gas supply system, and the peripheral gas supply system shown in FIG. 1.

FIG. 2 is a plan view schematically showing a positional relation between the shower head, the clamps, the central gas supply system, and the peripheral gas supply system, which are shown in FIG. 1.

In FIG. 2, the two clamps 38 corresponding to the central buffer chamber 34 are arranged on the circumference of a circle centering around the shower head center at equal intervals, specifically, at each 180°±3°. Further, the central buffer chamber 34 is formed of a disc-like space centering on the shower head center. Therefore, in the central buffer chamber 34, the mixed gas is introduced symmetrically around the shower head center. As a result, the mixed gas can be uniformly supplied into the central buffer chamber 34.

Further, the two clamps 40 corresponding to the peripheral buffer chamber 35 are also arranged on the circumference of a circle centering around the shower head center at equal intervals, specifically, at each 180°±3°. The peripheral buffer chamber 35 is formed of an annular space centering around the shower head center. Therefore, also in the peripheral buffer chamber 35, the mixed gas is introduced symmetrically around the shower head center. As a result, the mixed gas can be uniformly supplied to the inside of the peripheral buffer chamber 35.

Further, in the shower head 24, the total number of the clamps 38 and 40 is four, and each of the clamps 38 and 40 is arranged at each rotational angle of 360°/4±3° in the rotational system centering around the shower head center. Specifically, the rotational angle between the adjacent clamps 38 and 40, which angle centers around the shower head center, is 90°±3°. Thereby, the mixed gas can be symmetrically introduced into the processing space S via the central buffer chamber 34 and the peripheral buffer chamber 35. Therefore, the distribution of the mixed gas introduced into the processing space S can be made more uniform.

Note that in the shower head 24, the coolant introducing sections 43a and 43b, and a PT sensor 44 which is a temperature measuring sensor, are arranged so as to avoid the clamps 38 and 40, the central gas supply system 39, and the peripheral gas supply system 41.

Returning to FIG. 1, in the substrate processing apparatus 10, a high pass filter 45 is electrically connected to the susceptor 13, and the high pass filter 45 passes the high-frequency power from the upper high-frequency power supply 30 to the ground. Further, a low pass filter 46 is electrically connected to the shower head 24, and the low pass filter 46 passes the high-frequency power from the lower high-frequency power supply 19 to the ground.

Further, in the substrate processing apparatus 10, a flow path, through which the gas above the ESC 14 is discharged to the outside of the chamber 11, is formed between the inside wall of the chamber 11 and the side surface of the ESC 14 (susceptor 13), and an exhaust plate 47 is arranged in the middle of the flow path. The exhaust plate 47 is a plate-shaped member having a number of holes, and captures or reflects the plasma generated in the processing space S, so as to prevent the leakage of the plasma.

In the substrate processing apparatus 10, when the mixed gas is introduced into the processing space S from the shower head 24, and when the high-frequency power is supplied to the processing space S from the susceptor 13 and the shower head 24, a high frequency electric field is generated in the processing space S, so that the processing gas in the mixed gas is excited to become plasma. The plasma performs etching processing to the wafer W.

Note that the operation of each component of the above described substrate processing apparatus 10 is controlled by a CPU of a controller (not shown) provided in the substrate processing apparatus 10 on the basis of a program corresponding to the etching processing.

According to the substrate processing apparatus 10 of the present embodiment, the two clamps 38 corresponding to the central buffer chamber 34 and connected to the central gas supply system 39 are arranged on the circumference of a circle centering around the shower head center at equal intervals. Further, the two clamps 40 corresponding to the peripheral buffer chamber 35 and connected to the peripheral gas supply system 41 are arranged on the circumference of a circle centering around the shower head center at equal intervals. Thereby, the processing gas can be uniformly supplied into the central buffer chamber 34 and the peripheral buffer chamber 35, so that it is possible to make uniform the distribution of the processing gas introduced into the processing space S via the central buffer chamber 34 and the peripheral buffer chamber 35. Further, the structure of the shower head 24 which supplies high-frequency power to the processing space S can be made symmetrical with respect to the shower head center, so that it is possible to make uniform the distribution of the electric field generated in the processing space S. As a result, the distribution of the density of plasma generated on the wafer W can be made uniform, so that it is possible to prevent the generation of arcing on the wafer W.

In the above described substrate processing apparatus 10, the total number of the clamps 38 and 40 is four, and hence the clamps 38 and 40 are arranged at each rotational angle of 90°±3° around the shower head center. Therefore, the distribution of the processing gas introduced into the processing space S can be made more uniform. Further, the structure of the shower head 24 can be made more symmetrical with respect to the shower head center.

Further, in the above described substrate processing apparatus 10, the four clamps 38 and 40 are arranged on the upper electrode supporting body 27 connected to the upper high-frequency power supply 30, and hence the structure formed by the upper electrode supporting body 27 to which the high-frequency power is supplied, and formed by the four clamps 38 and 40 can be made symmetrical. Thereby, the distribution of the electric field generated in the processing space S can be surely made uniform.

Further, in the above described substrate processing apparatus 10, the portions of the central gas supply system 39 and the peripheral gas supply system 41, which portions are respectively connected to the clamps 38 and 40, are made of a resin, and hence the high-frequency power supplied to the upper electrode supporting body 27 is prevented from being transmitted to the central gas supply system 39 and the peripheral gas supply system 41 via the clamps 38 and 40.

Therefore, the central gas supply system 39 and the peripheral gas supply system 41 do not affect the distribution of the electric field in the processing space S, so that the distribution of the electric field generated in the processing space S can be more surely made uniform.

In the above described embodiment, two clamps are arranged on the upper electrode supporting body 27 in correspondence with each of the buffer chambers, but the number of the clamps arranged in correspondence with each of the buffer chambers is not limited to two. For example, the number of the clamps may be three or more. In this case, N clamps corresponding to each of the buffer chambers are arranged on the circumference of a circle centering around the shower head center at equal intervals, specifically, at each 360°/N.

Figure 3:
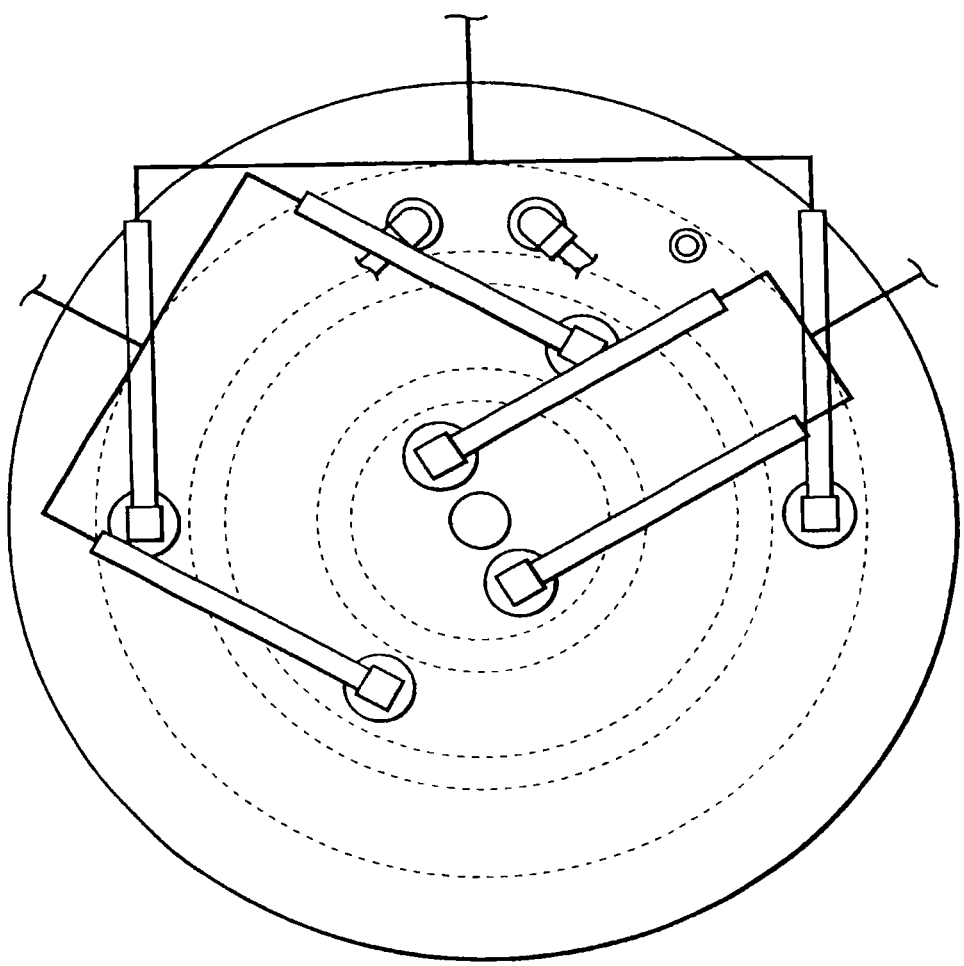
FIG. 3 is a sectional view schematically showing a configuration of a variation of the electrode structure according to the present embodiment.

Further, the number of the buffer chambers provided in the shower head 24 is not limited to two, but the number of the buffer chambers may be one, or three or more. Even in this case, when the total number of the clamps arranged on the upper electrode supporting body 27 is set to n, the clamps are arranged at each rotational angle of 360°/n±3° in the rotational system centering around the shower head center. For example, as shown in FIG. 3, when the shower head 24 has three buffer chambers, and when the number of the clamps arranged on the upper electrode supporting body 27 in correspondence with each of the buffer chambers is two, the total number of the clamps is 6, and hence the clamps are arranged at each rotational angle of 60°±3° in the rotational system centering around the shower head center.

Further, in the above described embodiment, the coolant introducing sections 43a and 43b are not symmetrically arranged with respect to the shower head center. However, in the upper electrode supporting body 27, the two coolant introducing sections may be symmetrically arranged. Specifically, the two coolant introducing sections may be arranged at equal intervals on the circumference of a circle centering around the shower head center, for example, at each 180°±3°. Thereby, the structure of the shower head 24 can be made still more symmetrical about the shower head center, so that the distribution of the electric field generated in the processing space S can be surely made uniform. Further, the plurality of components arranged on the upper electrode supporting body 27 may be preferably arranged as symmetrically as possible with respect to the shower head center.

Note that in the above described embodiment, the location tolerance in the arrangement of the clamps and the like is set to ±3°. However, the general machining tolerance is also in general ±3°, and hence special tolerance management to realize the above described arrangement of the clamps and the like is not needed. Thereby, it is possible to prevent the increase in manufacturing cost of the shower head 24.

EXAMPLE

Next, an example according to the present invention will be specifically described.

Example

First, when it was observed whether or not arcing was generated on a wafer W during the etching processing performed to the wafer W in the substrate processing apparatus 10, the generation of the arcing was not observed. Further, when the charge distribution on the surface of the wafer W was investigated, it was confirmed that the charges were distributed in the state of concentric circles, and that uneven distribution of the charges in the circumferential direction was not generated.

Figure 4A:
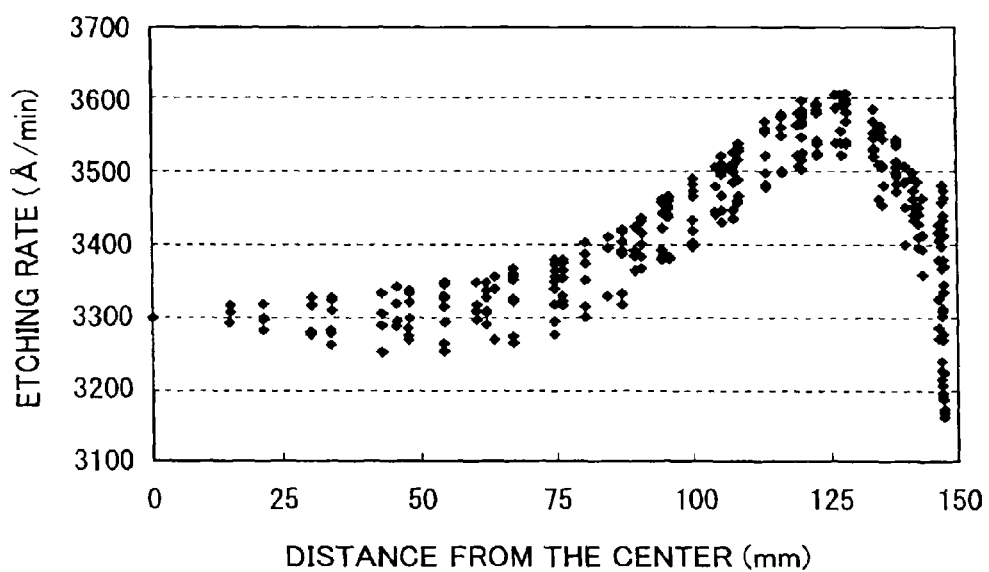
FIG. 4A and FIG. 4B are graphs showing the etching rate distribution at the time when etching processing is performed to an oxide film on a wafer by using the substrate processing apparatus according to the present embodiment and a conventional substrate processing apparatus.
Figure 4B:
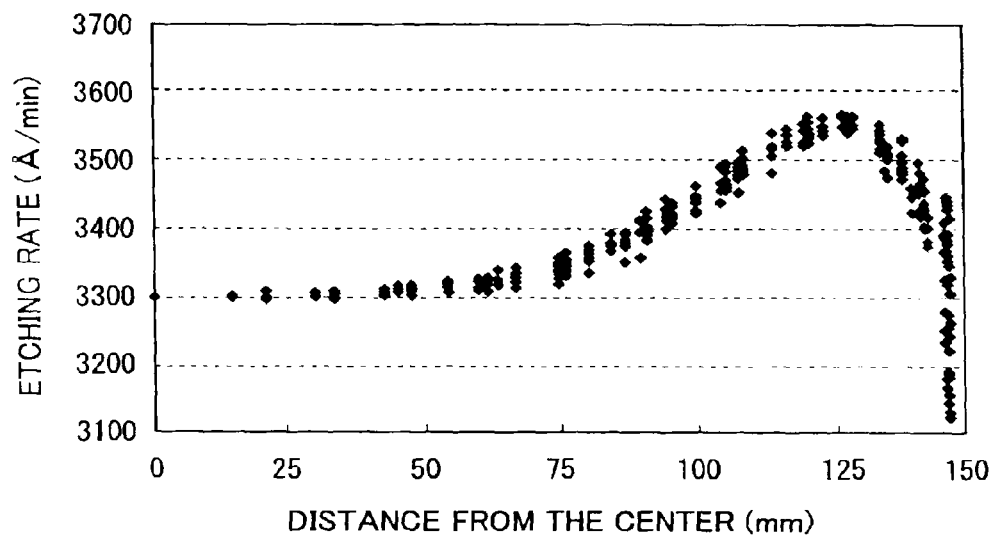

Further, the etching processing was performed to the oxide film on the wafer W in the substrate processing apparatus 10, and the distribution of etching rate at this time was observed. The observation result is shown in the graph of FIG. 4B. Further, the etching processing was performed to the photoresist film on the wafer W in the substrate processing apparatus 10, and the distribution of etching rate at this time was observed. The observation result is shown in the graph of FIG. 5B.

Comparison Example

Figure 7:
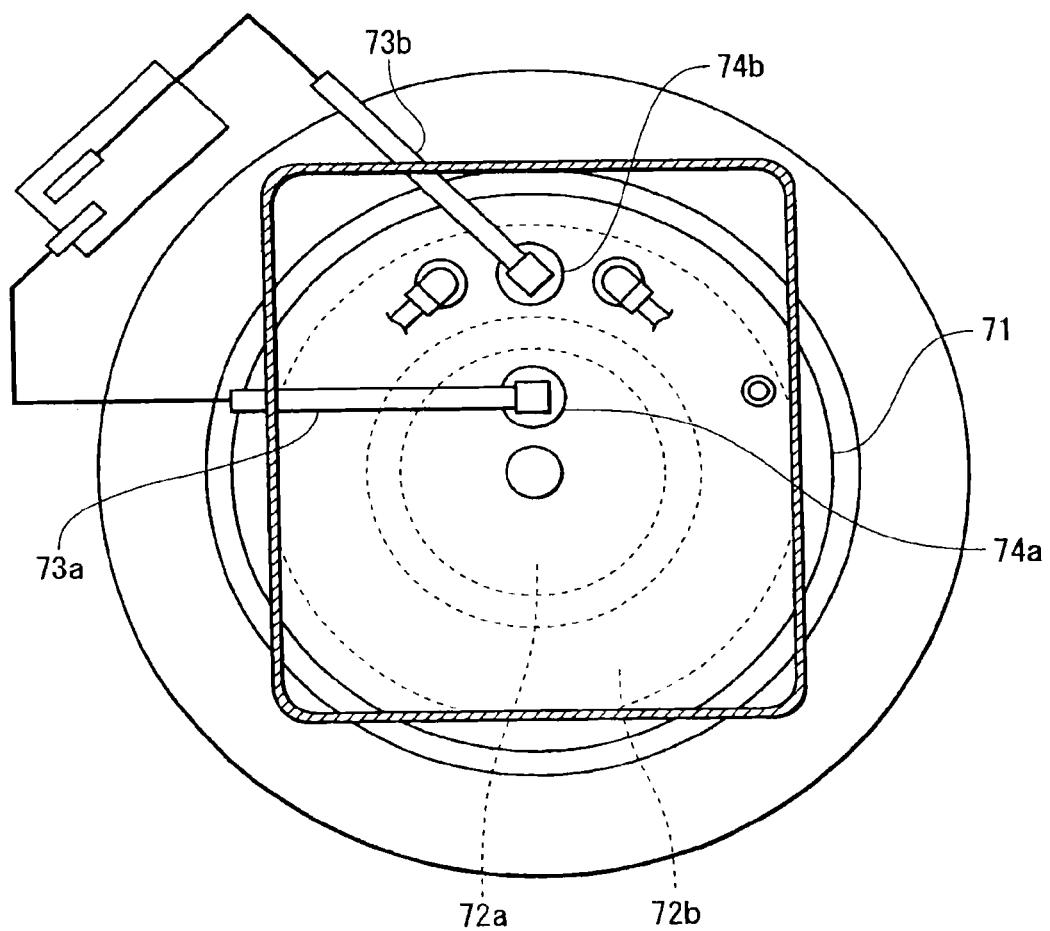
FIG. 7 is a plan view schematically showing a configuration of the conventional electrode structure.

First, when it was observed whether or not arcing was generated on a wafer W during the etching processing performed to the wafer W in the substrate processing apparatus (hereinafter referred to as "conventional substrate processing apparatus") provided with the electrode structure 70 shown in FIG. 7, it was confirmed that the arcing was generated at positions symmetrical with the positions at which the connecting sections 74a and 74b are arranged, with respect to the center of the shower head 71. Further, when the charge distribution on the surface of the wafer W was investigated, it was confirmed that uneven distribution of the charges was generated at positions symmetrical with the positions at which the connecting sections 74a and 74b are arranged, with respect to the center of the shower head 71.

Further, the etching processing was performed to the oxide film on the wafer W in the conventional substrate processing apparatus, the distribution of etching rate at this time was observed. The observation result is shown in the graph of FIG. 4A. Further, the etching processing was performed to the photoresist film on the wafer W in the conventional substrate processing apparatus, the distribution of etching rate at this time was observed. The observation result is shown in the graph of FIG. 5A.

By comparing Example with Comparison Example, it was seen that in Comparison Example, the arcing was generated, and the uneven distribution of the charges was also generated, while in Example, the arcing was not generated, and also the uneven distribution of the charges was not generated. From this fact, it was seen that in Example, the distribution of the processing gas introduced into the processing space S was made uniform, and the distribution of the electric field generated in the processing space S was also made uniform, as a result of which the distribution of the density of plasma generated on the wafer W was made uniform.

Figure 5A:
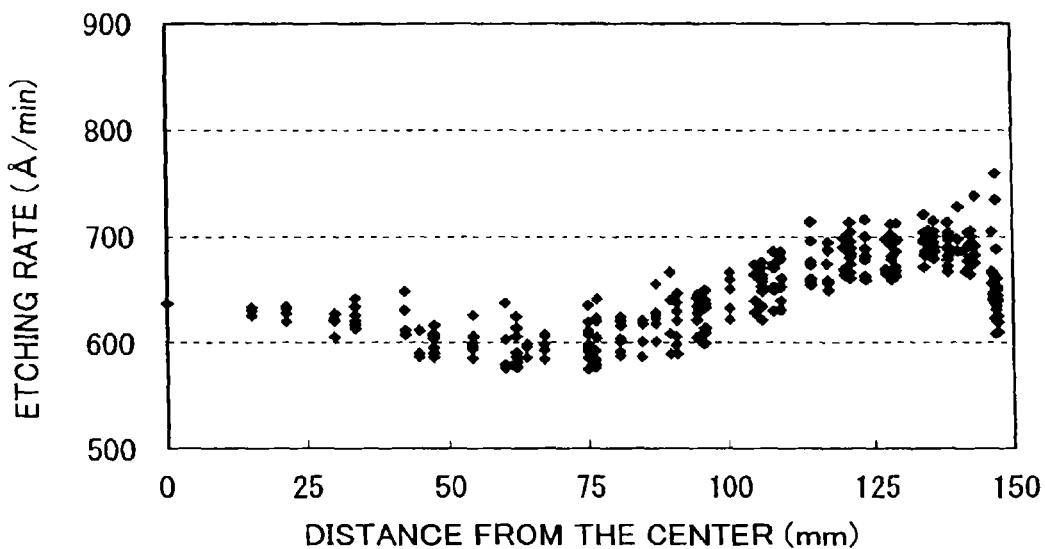
FIG. 5A and FIG. 5B are graphs showing the etching rate distribution at the time when etching processing is performed to a photoresist film on the wafer by using the substrate processing apparatus according to the present embodiment and the conventional substrate processing apparatus.
Figure 5B:
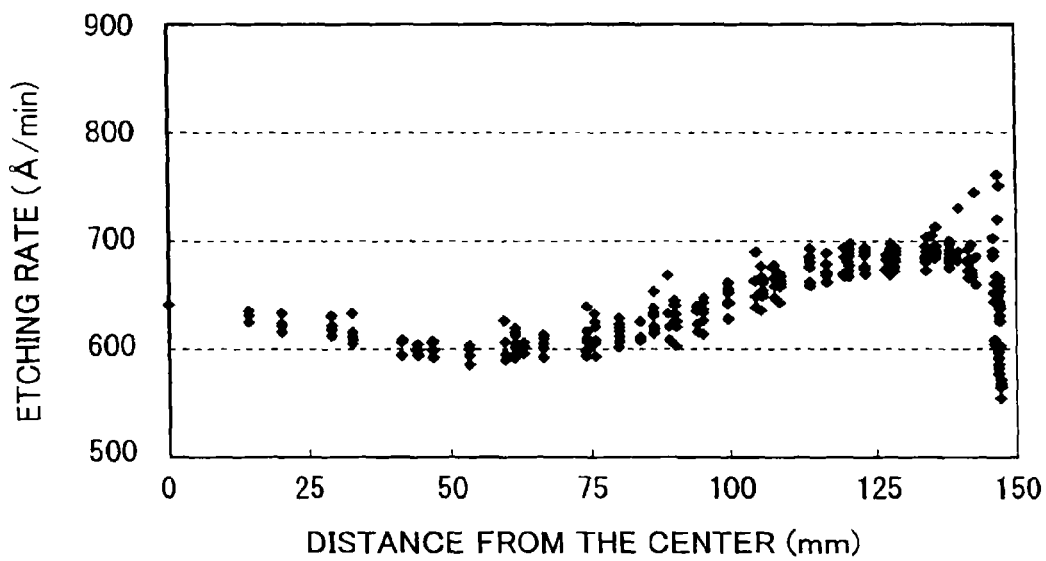
Figure 6:
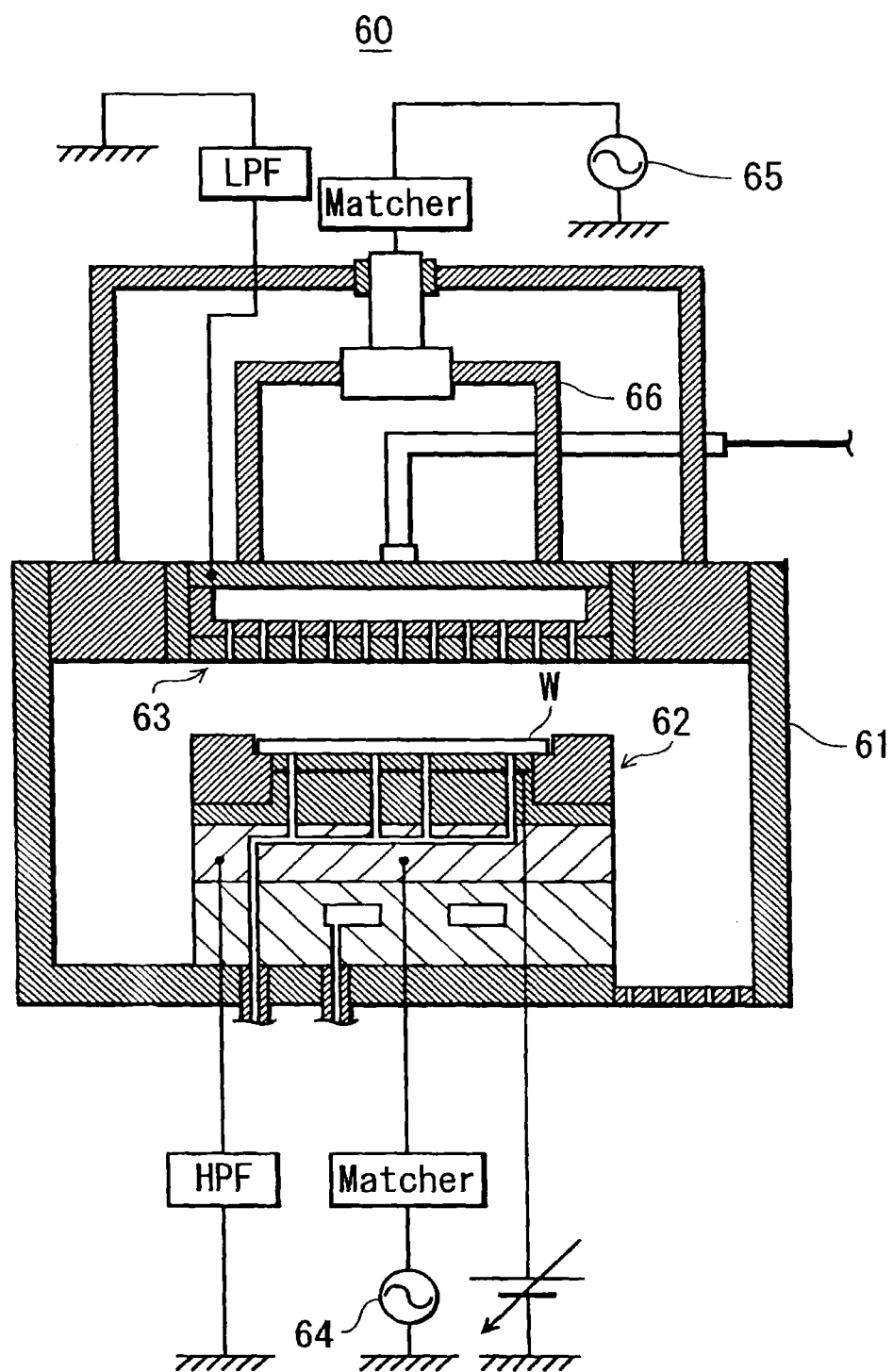
FIG. 6 is a sectional view schematically showing a configuration of the conventional substrate processing apparatus.

In addition, the graph of FIG. 4A was compared with the graph of FIG. 4B, and further the graph of FIG. 5A was compared with the graph of FIG. 5B. As a result, it was seen that in any of the etching processing of the oxide film and the etching processing of the photoresist film, the dispersion in the distribution of etching rate in Example is smaller than the dispersion in the distribution of etching rate in Comparison Example. Also from this fact, it was seen that in Example, the distribution of the density of plasma generated on the wafer W was made uniform.

What is claimed is:
1. A substrate processing apparatus comprising:
a chamber that houses a disk-shaped substrate;
a first electrode that is arranged in the chamber, the substrate being mounted on the first electrode;
a second electrode constituting a shower head that is arranged such as to face the mounted substrate and has a number of penetrating gas holes, the second electrode has therein a space;
a high-frequency power source that supplies high-frequency power between the first and second electrodes;

a central vacancy that is comprised of a central portion of the space in the shower head;

at least two annular buffer vacancies that are comprised of annular spaces formed outside the central vacancy and arranged sequentially in a radial direction of the shower head;

a plurality of annular partition wall members that divide the space in the shower head with respect to the radial direction of the shower head such as to form the central vacancy and the at least two annular buffer vacancies;

a plurality of pipes that are connected respectively to the central vacancy and the at least two annular buffer vacancies such as to supply processing gas and additional gas respectively to the central vacancy and the at least two annular buffer vacancies; and a branch flow rate adjusting apparatus that adjusts a flow rate of the processing gas which flow through each of the plurality of pipes; wherein each of the plurality of pipes is branched into at least two branched pipes, and the branched pipes are connected to each of the central vacancy and the at least two annular buffer vacancies via at least two connecting sections which are disposed on each of the central vacancy and the at least two annular buffer vacancies along a circumference of a circle arranged thereon at equal intervals, the at least two connecting sections belonging to each of the central vacancy and the at least two annular buffer vacancies are disposed symmetrically around the shower head center, regarding all the connecting sections of the plurality of pipes, one connecting section is shifted from another connecting section adjacent thereto at constant degrees in a rotational system centering around the center of the shower head, whereby a mixture of the processing gas and the additional gas is supplied symmetrically with respect to the center of the shower head and uniformly into the chamber so as to make uniform the distribution of an electric field generated in a processing space inside the chamber.

2. A substrate processing apparatus as claimed in claim 1, wherein the shower head is configured by a ceiling electrode plate, a cooling plate, and an upper electrode body which are stacked in this order from the side of the processing space of the chamber, and the ceiling electrode plate, the cooling plate, and the upper electrode body are made of a conductive material.

3. A substrate processing apparatus as claimed in claim 2, wherein the cooling plate has a coolant chamber therein and at least two coolant introducing sections from which a coolant is supplied to the coolant chamber, and the coolant introducing sections are arranged symmetrically with respect to the center of the shower head.

4. A substrate processing apparatus as claimed in claim 1, wherein the high-frequency power source is connected to the first electrode.

5. A substrate processing apparatus as claimed in claim 1, wherein the outside of a power supply tube which is directly connected to a central portion of the shower head is covered by a case-shaped grounding conductive member, and portions of the plurality of pipes existing in the inside of the grounding conductive member are made of an insulating material.

6. A substrate processing apparatus as claimed in claim 5, wherein the portions of the plurality of pipes existing in the inside of the grounding conductive member are made of a resin.

7. A substrate processing apparatus as claimed in claim 1, when the total number of all the connecting sections is set to n, each of all the connecting sections is arranged at each rotational angle of $360°/n \pm 3°$ in the rotational system centering around the center of the shower head.

* * * * *